United States Patent
Pu

(10) Patent No.: US 6,580,618 B2
(45) Date of Patent: Jun. 17, 2003

(54) LOW-PROFILE MULTI-CHIP MODULE

(75) Inventor: Han-Ping Pu, Taipei (TW)

(73) Assignee: Siliconware Precision Industries Co., Ltd. (TW)

( * ) Notice: Subject to any disclaimer, the term of this patent is extended or adjusted under 35 U.S.C. 154(b) by 0 days.

(21) Appl. No.: 09/912,276

(22) Filed: Jul. 24, 2001

(65) Prior Publication Data

US 2002/0149919 A1 Oct. 17, 2002

(30) Foreign Application Priority Data

Apr. 12, 2001 (TW) .................................. 90108743 A

(51) Int. Cl.⁷ ................................................ H05K 7/02
(52) U.S. Cl. ...................... 361/760; 361/783; 257/724; 257/737; 257/777
(58) Field of Search ................... 257/777, 778, 257/737, 738, 723, 724; 361/760, 783

(56) References Cited

U.S. PATENT DOCUMENTS

| | | | | |
|---|---|---|---|---|
| 5,222,014 A | * | 6/1993 | Lin | 228/180.22 |
| 5,386,341 A | * | 1/1995 | Olson et al. | 361/749 |
| 5,477,082 A | | 12/1995 | Buckley, III et al. | 257/679 |
| 5,608,262 A | * | 3/1997 | Degani et al. | 257/723 |
| 5,646,828 A | * | 7/1997 | Degani et al. | 257/707 |
| 5,784,261 A | | 7/1998 | Pedder | 361/767 |
| 5,812,379 A | * | 9/1998 | Barrow | 361/773 |
| 5,869,894 A | * | 2/1999 | Degani et al. | 257/685 |
| 5,909,056 A | * | 6/1999 | Mertol | 257/704 |
| 5,977,640 A | * | 11/1999 | Bertin et al. | 257/686 |
| 6,150,724 A | * | 11/2000 | Wenzel et al. | 257/724 |
| 6,274,214 B1 | * | 8/2001 | Chan et al. | 257/678 |
| 6,297,551 B1 | * | 10/2001 | Dudderar et al. | 257/686 |

* cited by examiner

*Primary Examiner*—David L. Talbott
*Assistant Examiner*—José H. Alcala
(74) *Attorney, Agent, or Firm*—Peter F. Corless; Steven M. Jensen; Edwards & Angell, LLP

(57) ABSTRACT

A low-profile multi-chip module is provided, wherein two or more chips are integrated in a package unit connected to a printed circuit board (PCB), to provide a manifold level of functionality and data storage capacity. The multi-chip module includes at least a first chip and a second chip connected to a predetermined position on an active surface of the first chip by chip-on-chip technology, allowing the active surface of the first chip to be further mounted to a substrate by flip-chip technology. The substrate is attached to the PCB by surface-mount technology, and interposed between the first chip and the PCB. At least a passive component is mounted on the PCB at a position beside the substrate and underneath the second chip. This structure allows the use of a PCB having a smaller layout area for implementing the multi-chip module, thereby desirably reducing the overall structural profile.

12 Claims, 4 Drawing Sheets

LOW-PROFILE MULTI-CHIP MODULE

FIELD OF THE INVENTION

The present invention relates to multi-chip modules and fabricating methods thereof and more particularly, to a multi-chip module and a fabricating method thereof, in which two or more semiconductor chips are integrated in one single package unit for offering manifold increase in functionality or data storage capacity.

BACKGROUND OF THE INVENTION

Multi-chip module technology allows two or more semiconductor chips to be integrated in one single package unit and then connected to a printed circuit board for forming a multi-chip module, which is capable of offering a manifold level of functionality or data storage capacity. Similarly, a general memory module, such as a flash memory module, typically has two or more memory chips integrated in one single memory module for providing significant increase in data storage capacity.

Illustrated in FIG. 1 and FIG. 2 are two conventional multi-chip modules. Referring to FIG. 1, a conventional multi-chip module is constructed based on a stacked dual-chip BGA (Ball Grid Array) semiconductor package, including (a) a substrate 100; (b) a first semiconductor chip 110 mounted on the substrate 100; (c) a second semiconductor chip 120 stacked on the first semiconductor chip 110; (d) a set of first bonding wires 131 for electrically connecting the first semiconductor chip 110 to the substrate 100; (e) a set of second bonding wires 132 for electrically connecting the second semiconductor chip 120 to the substrate 100; (f) an encapsulant 140 for encapsulating the two semiconductor chips 110, 120; and (g) ball grid array 150 implanted on a back side of the substrate 100 for mechanically bonding and electrically connecting the BGA package to a printed circuit board (PCB) 160. After the BGA package is mounted on the PCB 160, a plurality of passive components 170 are further bonded to predetermined positions on the PCB 160 beside the BGA package. This results in a dual-chip module.

FIG. 2 shows another conventional multi-chip module constructed based on a dual-chip COC (Chip-On-Chip) BGA semiconductor package, including: (a) a substrate 200; (b) a first semiconductor chip 210 mounted on the substrate 200; (c) a second semiconductor chip 220 mounted on the first semiconductor chip 210 through a plurality of solder bumps 221 by using chip-on-chip (COC) technology; (d) a set of bonding wires 230 for electrically connecting the first semiconductor chip 210 to the substrate 200; (e) an encapsulant 240 for encapsulating the two semiconductor chips 210, 220; and (g) ball grid array 250 implanted on a back side of the substrate 200 for mechanically bonding and electrically connecting the semiconductor package to a PCB 260. After the semiconductor package is mounted on the PCB 260, a plurality of passive components 270 are further bonded to predetermined positions on the PCB 260 beside the semiconductor package. This also results in a dual-chip module.

One common drawback to the foregoing two dual-chip modules, however, is that a relatively larger PCB is required for disposing the semiconductor package together with the associated passive components thereon, which undesirably makes the resulted dual-chip modules less compact in size.

Related patents include, for example, U.S. Pat. No. 5,646,828 entitled "THIN PACKAGING OF MULTI-CHIP MODULES WITH ENHANCED THERMAL/POWER MANAGEMENT"; U.S. Pat. No. 5,477,082 entitled "BI-PLANAR MULTI-CHIP MODULE"; and U.S. Pat. No. 5,784,261 entitled "MICROCHIP MODULE ASSEMBLIES"; to name just a few.

The above patents, however, still have the foregoing drawback of making the resulted multi-chip module less compact in size. Therefore, it is desired to construct a multi-chip module more miniaturized in profile.

SUMMARY OF THE INVENTION

A primary objective of the present invention is to provide multi-chip module and a fabricating method thereof, in which the multi-chip module can be made more compact in size while allowing high density of integration.

In accordance with the foregoing and other objectives, the invention proposes a new multi-chip module and a fabricating method thereof.

The fabricating method of the invention is firstly to prepare a first semiconductor chip and at least one second semiconductor chip; wherein the first semiconductor chip is larger in area size than the second semiconductor chip and is partitioned at least into a first connecting region and a second connecting region. The multi-chip module constructed according to the invention can contain two, three, four or more chips, depending on the area size of the first semiconductor chip.

With the use of chip-on-chip (COC) technology, the second chip is mounted on the second connecting region of the first semiconductor chip. Subsequently, the first connecting region of the first semiconductor chip is disposed on an upper surface of a substrate by using flip-chip technology. Then, the substrate has a lower surface attached to a printed circuit board through surface-mount technology (SMT). Moreover, at least one passive component is bonded to the printed circuit board (PCB) at a predetermined position beside the substrate and directly beneath the second semiconductor chip. This arrangement allows a PCB having a smaller layout area to be used in the invention, making the resulted multi-chip module more compact in size than the prior art.

BRIEF DESCRIPTION OF THE DRAWINGS

The invention can be more fully understood by reading the following detailed description of the preferred embodiments, with reference made to the accompanying drawings, wherein.

DETAILED DESCRIPTION OF THE PREFERRED EMBODIMENT

Figure 3A:
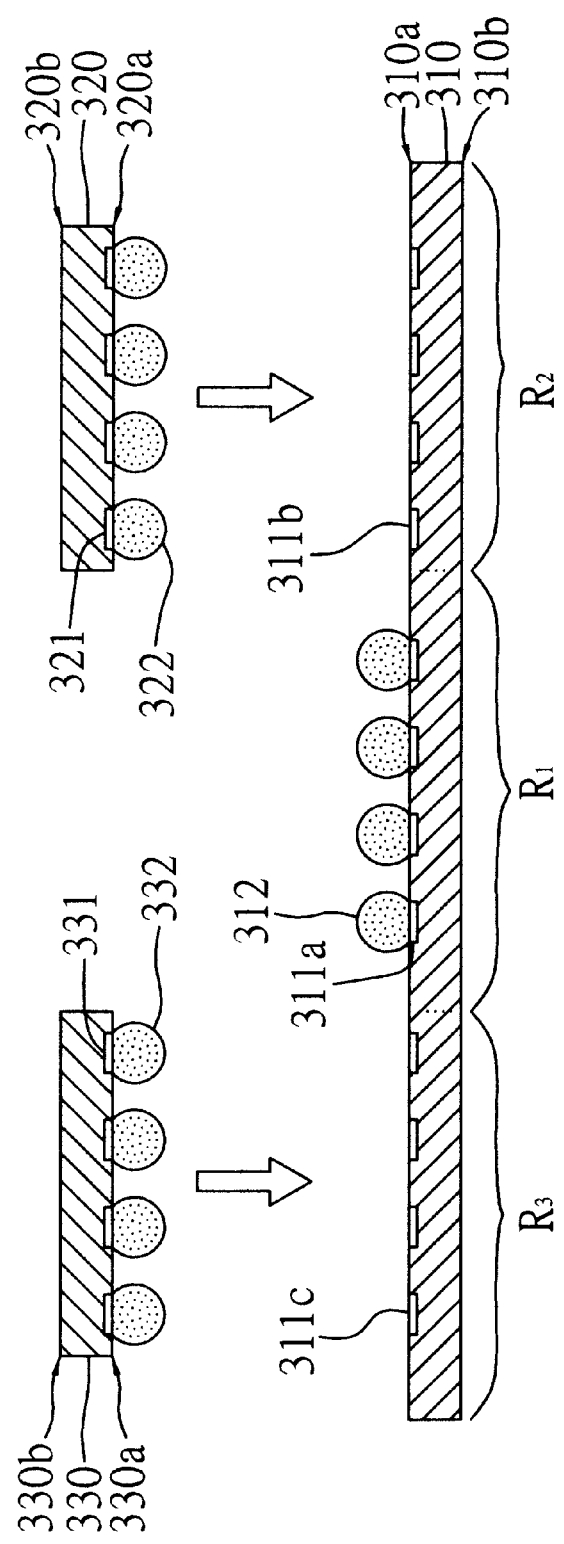
FIGS. 3A–3C are schematic sectional diagrams used to depict the steps involved in the fabricating method of the multi-chip module of the invention.
Figure 3B:
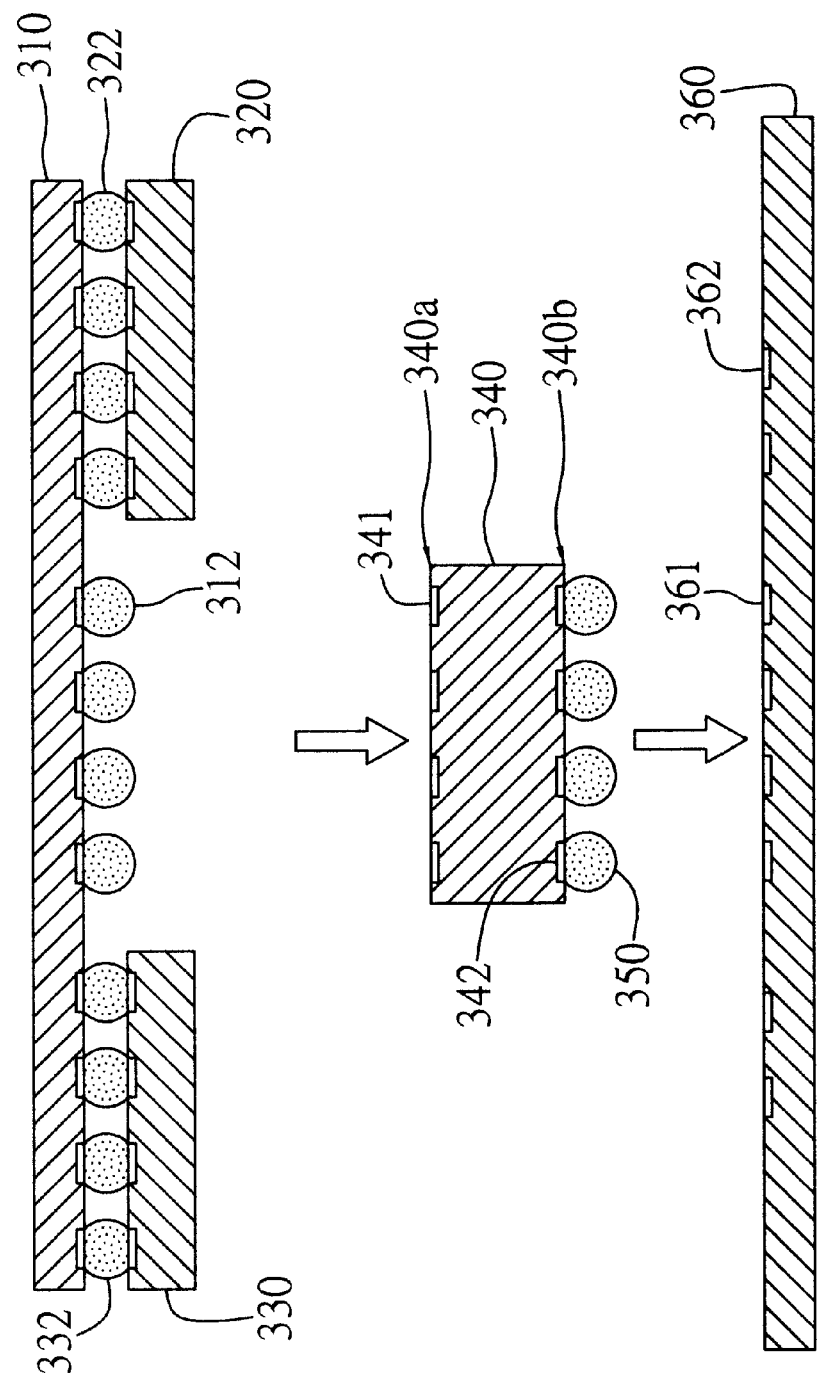

Illustrated in FIGS. 3A–3B are the steps involved in the fabricating method of the multi-chip module of one preferred embodiment according to the invention. In this embodiment, fabrication of a triple-chip module of the invention is demonstrated; however, it is to be noted that the invention can also be used to fabricate a dual-chip module or a multi-chip module having four or more semiconductor chips.

Referring first to FIG. 3A, as fabrication of a triple-chip module is illustrated in this embodiment, the first step of the fabricating method is to prepare three semiconductor chips, including a first semiconductor chip 310, a second semiconductor chip 320, and a third semiconductor chip 330.

The first semiconductor chip 310 has an active surface 310a and an inactive surface 310b, while the active surface 310a is partitioned into three regions; a first connecting region R1, a second connecting region R2, and a third connecting region R3. Further, on the active surface 310a there are formed a plurality of input/output (I/O) pads, including a first set of I/O pads 311a disposed in the first connecting region R1, a second set of I/O pads 311b disposed in the second connecting region R2, and a third set of I/O pads 311c disposed in the third connecting region R3. Moreover, on the first set of I/O pads 311a there are mounted a plurality of solder bumps 312 used for subsequent flip-chip application. It is to be noted that the three connecting areas R1, R2, R3 are defined on the active surface 310a of the first semiconductor chip 310 in correspondence with the triple-chip module being fabricated in this embodiment. However, the invention can further be applied to a multi-chip module containing two, four or more chips, depending on the area size of the first semiconductor chip 310.

The second semiconductor chip 320 has an active surface 320a and an inactive surface 320b, while the active surface 320a is formed with a set of I/O pads 321 thereon. Further, on the I/O pads 321 there are mounted a plurality of solder bumps 322 used for subsequent COC application. The second semiconductor chip 320 is necessarily smaller in area size than the first semiconductor chip 310 and approximately equal in dimension to the second connecting region R2 on the active surface 310a of the first semiconductor chip 310.

The third semiconductor chip 330 has an active surface 330a and an inactive surface 330b, while the active surface 330a is formed with a set of I/O pads 331 thereon. Further, on the I/O pads 331 there are mounted a plurality of solder bumps 332 used for subsequent COC application. The third semiconductor chip 330 is necessarily smaller in area size than the first semiconductor chip 310 and approximately equal in dimension to the third connecting region R3 on the active surface 310a of the first semiconductor chip 310.

Referring further to FIG. 3B, with the use of COC technology, the second semiconductor chip 320 is integrated with the first semiconductor chip 310 by bonding the I/O pads 321 on the active surface 320a of the second semiconductor chip 320 through the solder bumps 322 to the second set of I/O pads 311b in the second connecting region R2 on the active surface 310a of the first semiconductor chip 310. Furthermore, the third semiconductor chip 330 can be similarly integrated with the first semiconductor chip 310 by bonding the I/O pads 331 on the active surface 330a of the third semiconductor chip 330 through the solder bumps 332 to the third set of I/O pads 311c in the third connecting region R3 on the active surface 310a of the first semiconductor chip 310.

After completing the above COC process, the next step is to integrate the first semiconductor chip 310 with a substrate 340 through flip-chip technology. The substrate 340 can be a silicon substrate, an organic substrate or a ceramic substrate, which has an upper surface 340a and a lower surface 340b. The upper surface 340a is formed with a set of top contact pads 341, while on the lower surface 340b there are formed a set of bottom contact pads 342, which are electrically connected through a plurality of conductive traces and vias (not shown) to the top contact pads 341. Further, the substrate 340 need to be approximately equal in area size to the first connecting region R1 on the active surface 310a of the first semiconductor chip 310, while the height of the substrate 340 should be greater than the total height of the second semiconductor chip 320 or the third semiconductor chip 330 plus subsequently-used passive components (shown in FIG. 3C by the reference numeral 370).

With the use of flip-chip technology, the first semiconductor chip 310 is mounted on the substrate 340 in such a manner that the first set of I/O pads 311a in the first connecting region R1 on the active surface 310a of the first semiconductor chip 310 are bonded through the solder bumps 312 to the top contact pads 341 on the upper surface 340a of the substrate 340.

The next step is to connect the substrate 340 to a printed circuit board (PCB) 360 having a set of contact pads 361 and a plurality of passive-component bond pads 362 through surface-mount technology (SMT).

Figure 3C:
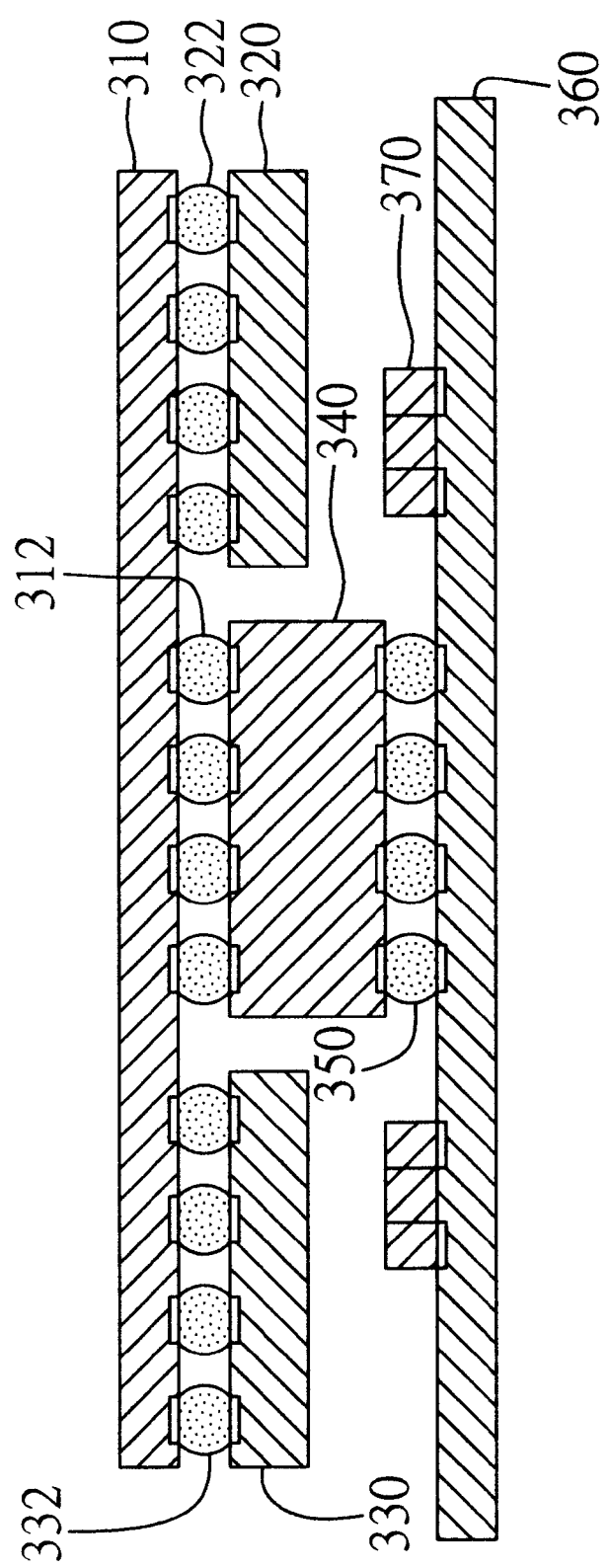

Referring further to FIG. 3C, with the use of the SMAT process, the substrate 340 is mounted on the PCB 360 in such a manner that the bottom contact pads 342 on the lower surface 340b of the substrate 340 are bonded through bail grid array 350 to the contact pads 361 on the PCB 360. Finally, a plurality of passive components 370 are bonded to the passive-component bond pads 362 on the PCB 360. This completes the fabrication of the multi-chip module of the invention.

Figure 1:
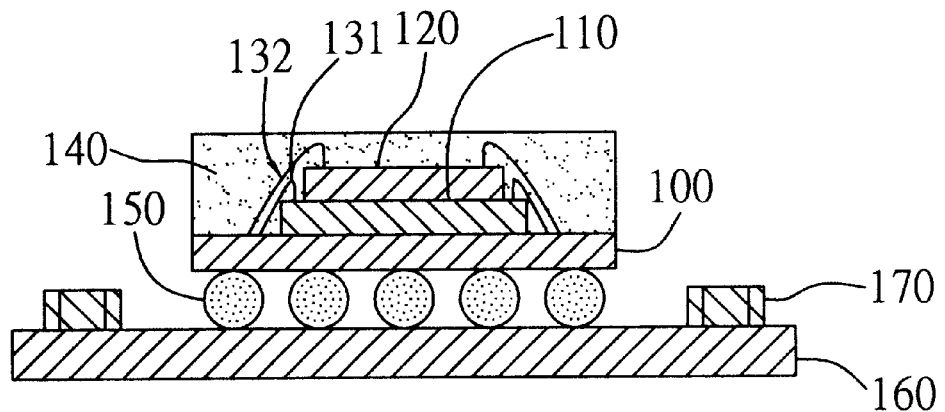
FIG. 1 (PRIOR ART) is schematic sectional diagram of a conventional multi-chip module.
Figure 2:
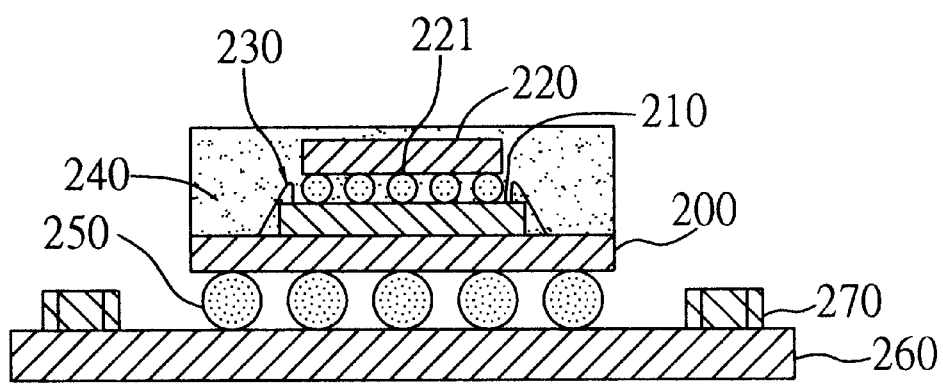
FIG. 2 (PRIOR ART) is a schematic sectional diagram of another conventional multi-chip module.

As comparing FIG. 3C with FIG. 1 and FIG. 2, the invention is characterized by mounting the passive components 370 on the PCB 360 at positions beside the substrate 340 and directly beneath the second semiconductor chip 320 and the third semiconductor chip 330, which allows the multi-chip module to be implemented with the use of a PCB having a smaller layout area, and thus the resulted multi-chip module can be made more compact in size The invention is therefore more advantageous to use than the prior art.

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A multi-chip module, comprising:
    (a) a first semiconductor chip having an active surface and an inactive surface, wherein the active surface is partitioned at least into a first connecting region and a second connecting region;
    (b) a second semiconductor chip having an active surface and an inactive surface, and mounted on the second connecting region of the first semiconductor chip through chip-on-chip technology;
    (c) a substrate having an upper side and a lower side, wherein the upper side is used for mounting the first connecting region of the first semiconductor chip thereon through flip-chip technology, and the substrate has a predetermined height larger than the thickness of the second semiconductor chip; and
    (d) a printed circuit board for mounting the substrate thereon through surface-mount technology.

2. The multi-chip module of claim 1, further comprising:
    at least one passive component bonded to the printed circuit board at a predetermined position beside the substrate and beneath the second semiconductor chip.

3. The multi-chip module of claim 1, wherein the first and second semiconductor chips are memory chips.

4. The multi-chip module of claim 1, wherein the substrate is a silicon-made substrate.

5. The multi-chip module of claim 1, wherein the substrate is an organic substrate.

6. The multi-chip module of claim 1, wherein the substrate is a ceramic substrate.

7. A multi-chip module, comprising:
   (a) a first semiconductor chip having an active surface and an inactive surface, wherein the active surface is partitioned into a first connecting region, a second connecting region, and a third connecting region;
   (b) a second semiconductor chip having an active surface and an inactive surface, wherein the active surface is mounted on the second connecting region of the first semiconductor chip through chip-on-chip technology;
   (c) a third semiconductor chip having an active surface and an inactive surface, wherein the active surface is mounted on the third connecting region of the first semiconductor chip through chip-on-chip technology;
   (d) a substrate having an upper side and a lower side, wherein the upper side is used for mounting the first connecting region of the first semiconductor chip thereon through flip-chip technology, and the substrate has a predetermined height larger than the overall thickness of the second semiconductor chip or the third semiconductor chip; and
   (e) a printed circuit board for mounting the substrate thereon through surface-mount technology.

8. The multi-chip module of claim 7, further comprising:
   at least one passive component bonded to the printed circuit board at a predetermined position beside the substrate and beneath the second semiconductor chip or the third semiconductor chip.

9. The multi-chip module of claim 7, wherein the first, second, and third semiconductor chips are memory chips.

10. The multi-chip module of claim 7, wherein the substrate is a silicon-made substrate.

11. The multi-chip module of claim 7, wherein the substrate is an organic substrate.

12. The multi-chip module of claim 7, wherein the substrate is a ceramic substrate.

* * * * *